United States Patent [19]
Fendt et al.

[11] Patent Number: 6,095,568
[45] Date of Patent: Aug. 1, 2000

[54] DEVICE FOR SEALING PRESSURE COMPENSATION OPENINGS

[75] Inventors: Günter Fendt, Schrobenhausen; Richard Baur, Pfaffenhofen, both of Germany

[73] Assignee: Temic Telefunken microelectronic GmbH, Heilbronn, Germany

[21] Appl. No.: 09/030,820

[22] Filed: Feb. 26, 1998

[30] Foreign Application Priority Data

Feb. 28, 1997 [DE] Germany .............................. 197 08 116

[51] Int. Cl.⁷ .................................................. B42D 15/00
[52] U.S. Cl. ................................. 283/81; 283/79; 283/72; 283/95
[58] Field of Search .................................. 283/72, 74, 79, 283/81, 95, 117; 40/299, 625, 643; 277/317, 318; 428/913

[56] References Cited

U.S. PATENT DOCUMENTS

| | | | |
|---|---|---|---|
| 3,989,279 | 11/1976 | Levy | 283/95 |
| 5,141,237 | 8/1992 | Yamada et al. | 277/317 |
| 5,423,139 | 6/1995 | Feldman | 283/79 X |
| 5,577,914 | 11/1996 | Takahashi et al. | 283/79 X |
| 5,720,498 | 2/1998 | McAuley et al. | 283/79 |

FOREIGN PATENT DOCUMENTS

| | | |
|---|---|---|
| 3248715 | 7/1984 | Germany . |
| 9107992 U | 3/1992 | Germany . |
| 4234919 | 4/1994 | Germany . |

*Primary Examiner*—Willmon Fridie, Jr.
*Attorney, Agent, or Firm*—Venable; George H. Spencer; Norman N. Kunitz

[57] ABSTRACT

The invention relates to a device for sealing pressure compensation openings in components in particular of a motor vehicle control unit. Previously, pressure compensation openings were sealed in the interior of the housing by a watertight and gas-permeable material affixed by adhesion. In accordance with the invention, the opening is sealed from the outside with a two-layered material where a wide-area first layer consists of a material that can be inscribed and a second layer, which can also be provided over just a part of the total area, is a watertight and gas-permeable membrane. At those places where pressure compensation occurs, the first layer is removed so that only the membrane acts. The first layer can be used here as a label. Advantages offered by this device are that the housing and the membrane are joined over a much larger area, the process can be monitored, and one process step is saved.

3 Claims, 1 Drawing Sheet

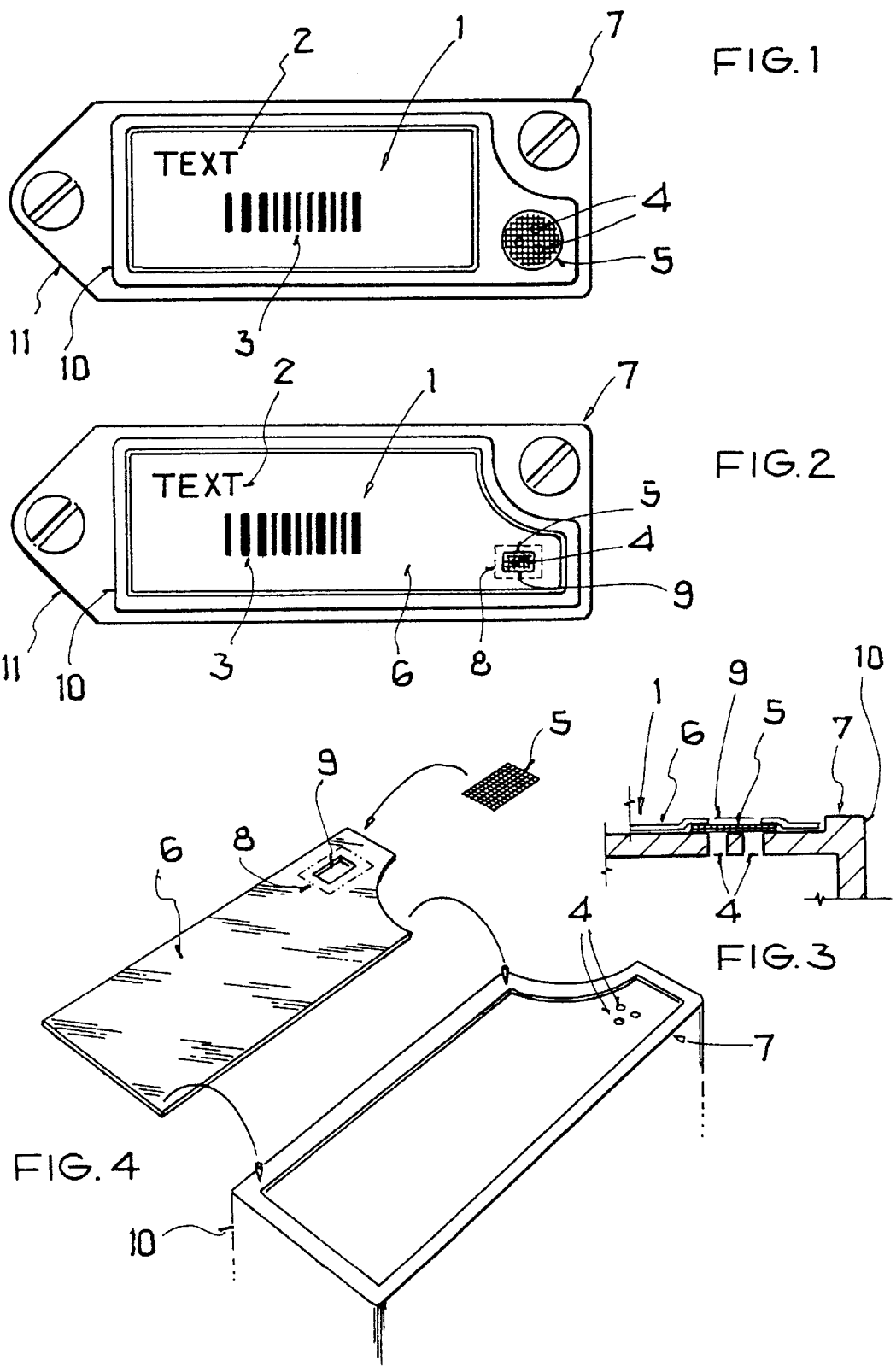

DEVICE FOR SEALING PRESSURE COMPENSATION OPENINGS

BACKGROUND OF THE INVENTION

The invention relates to a device for sealing pressure compensation openings in accordance with the preamble of Patent claim 1.

As a rule, electronic control units are built into a housing in order to protect them against external influences. The requirements imposed on this housing are particularly high when it is used in a motor vehicle. On the one hand the housing must have so-called pressure compensation openings at which pressure compensation can take place between the interior of the housing and the surroundings, and on the other hand for these components the housing must prevent water from entering so that the electronic circuit is reliably protected against damage caused by water or moisture. This is achieved at the present time by providing small holes acting as pressure compensation openings in the housing, which as a rule is made of metal or a hard plastic material, thus allowing air to circulate. In order to protect against water, these holes are closed from within by attaching an adhesive gas-permeable and watertight piece of sheeting known, for example, under the name of Goretex or Sympatex. Because this watertight and gas-permeable material is very expensive, the pressure compensation openings are covered over as small an area as possible. Therefore, the watertight and gas-permeable piece of sheeting is placed in the interior so that it cannot be removed unintentionally. This state of the art is shown in FIG. 1 where the electronic device is contained in the two-part housing 7. The one housing part 10 is pot-shaped and generally made of a plastic material while the other housing part 11 acts as a cover at the top or bottom. This housing part is made of metal and is equipped with means for attaching to the motor vehicle.

The label 1 with inscription 2 and barcode 3 is affixed by adhesion to the housing 7, in particular to the pot-shaped housing part 10. The housing 7 itself is attached by screws. Alongside the label, the pressure compensation openings 4 can be seen which are sealed from within over as small an area as possible by means of the gas-permeable and watertight piece of sheeting 5. The illustration shows the entire piece of sheeting at this point, although in fact it is situated on the inside of the housing, in particular in the interior of the pot-shaped housing part 10.

A disadvantage here, however, is that an additional working step is needed for sealing the pressure compensation openings with the adhesive gas-permeable and watertight piece of sheeting. Another disadvantage is due to the fact that this step in the process cannot be reliably monitored and inspected.

SUMMARY OF THE INVENTION

The object of the invention is to provide a device for sealing pressure compensation openings of the type described at the outset with which the pressure compensation openings are sealed watertight and gas-permeable and the attachment of which requires no additional process step and whose fitting can be monitored and inspected.

According to the invention a two-layered piece of sheeting is attached by adhesion from the front onto the component and over the pressure compensation openings, the second layer being shaped continuously or partially and made of a watertight and gas-permeable material, and the first layer that is shaped continuously being removed at those places where pressure compensation takes place leaving the pressure compensation openings covered by the second layer only.

The advantages obtained by the invention are the wide-area and favorable adhesion around the pressure compensation openings from the outside. This allows monitoring of the process step that includes the sealing of the pressure compensation openings.

Advantageous further developments of the invention are to be found in the dependent claims. Here, the first layer can be inscribed so that the device according to the invention can be used as a typeplate or label andlor a barcode can be affixed to it. This allows the typeplate or a similar device to be affixed and the pressure compensation openings to be sealed watertight and gas-permeable in a single process step.

BRIEF DESCRIPTION OF THE DRAWINGS

An embodiment example of the invention will now be described with reference to FIGS. 2 to 4.

The figures show:

FIG. 1: Embodiment example according to the state of the art;

FIG. 2: Top view on a sealing device in accordance with the invention;

FIG. 3: Sectional view of the sealing device in accordance with the invention;

FIG. 4: Rear view of the sealing device in accordance with the invention.

DESCRIPTION OF THE PREFERRED EMBODIMENTS

FIG. 2 shows the top view on a sealing device in accordance with the invention. In the application shown here, the sealing device is an inscribed label 1 on which there is a barcode 3 and comprising multiple layers 5 and 6. This label is attached to the housing 7 and in particular to the pot-shaped housing part 10.

The four pressure compensation openings 4 are located here that have been made visible in the drawing schematically only but are actually covered by the label 1. The first, upper visible layer of this label 1 is made of a plastic material that can be inscribed and which as a rule is impermeable to air and is watertight. An adhesive substance is applied to the underside of this plastic material 6. The label 1 is large enough to cover the pressure compensation openings 4, but the upper layer 6 is removed at those places where pressure compensation is to take place. This is shown by the continuous line 9. At these places, the second layer 5 is visible which is made of an air-permeable, watertight material such as, for example, Goretex or Sympatex. The pressure compensation openings 4 are situated beneath this layer 5. In the embodiment example, the second layer 5 is only partially attached to the underside of the first layer 6 coated with an adhesive substance, for cost reasons. This is shown by the broken line 8. This second layer 5, which is applied only partially, covers the pressure compensation openings 4 over as small an area as possible in the housing 7. In the case of larger openings 4, the second layer 5 can also be applied over the whole area of the first layer 6 and then attached by adhesion to the corresponding housing part, the first layer 6 being removed at those places where pressure compensation is required to take place. Where there are several pressure compensation openings 4, each individual opening can be covered by a separate partial piece. As an alternative, all openings can be sealed by a continuous piece, as shown in the Figures. It is important here that a sufficiently large adhesion surface remains between the first layer 6 and the second layer 5 so that the second layer 5 cannot slip away or so that the second layer 5 adheres directly to the housing 7. The first layer 6 in the embodiment example can be inscribed. Thus, an alphanumeric text 2 such as the type designation or the date of manufacture and also the barcode 3 and other relevant data can be printed on the first layer 6 so that the sealing device can be used as a label 1. This label 1, which has a large surface area compared with the pressure compensation openings 4, can be attached by adhesion from above with reproducible precision at the same place on the housing 7 in such a way that it is clearly visible. As a rule, the inscribed two-layered label 1 is cut to size and the first layer has already been removed from the places where pressure compensation is later to occur. It is advisable to protect the adhesive side of the first layer 6 by means of a cover which is removed just before attaching the label 1 to the housing 7. Incorrect positioning or another fault on attaching the label 1 to the housing part 7 can be detected very simply even by machines, eg. optically or mechanically, or at a final inspection.

FIG. 3 shows a sectional view of the sealing device in accordance with the invention. It shows a housing 7 the pressure compensation openings 4 of which are situated in the pot-shaped housing part 10 and sealed watertight and gas-permeable by means of the previously described two-layered sealing device. The pressure compensation openings 4 are contained in the housing 7. These are covered by a gas-permeable watertight membrane 5, the second layer. It is joined to the first layer 6 by an adhesive substance and, for cost reasons, affixed over the pressure compensation openings 4 over as small a surface area as possible and only partially. In this illustration it can be seen clearly that the second layer 5 is affixed to the housing 7 by the first layer 6 by adhesion. If the first layer 6 is an airtight and watertight piece of sheeting, the joint between housing 7 and membrane 5 is indeed hermetically sealed. This means that the air can escape from the openings 4 in the housing only at those places where the first layer 6 has been removed.

FIG. 4 shows a rear view of the sealing device. The adhesive underside of the first layer 6, to which the second layer 5 is applied in the region of the broken line 8, can be seen here together with the housing 7, in particular the pot-shaped housing part 10, with the pressure compensation openings 4. In the drawing, the two layers 5, 6 are shown separately for the sake of clarity. They have, however, already been joined together by adhesion before being affixed to the housing 7. The small region enclosed by the continuous line 9 indicates where the first layer 6 has been removed. However, the air-permeable but watertight membrane 5 is effective over this area. Below this region, there are later one or more housing openings 4 which are protected by the second layer 5. Also, with a label of this kind, there can be another layer on the reverse side to protect against dirt or the adhesive and this layer is pulled off before adhering the label 1 to the housing 7.

In all the figures, however, the size and shape of the cutout 9 in the label 1 have no effect on the mode of functioning. This means that in the case of round housing openings 4 the cutout 9 in the label 1 can be rectangular as shown in the diagram, but it could also be oval, round, square or alphanumeric.

Furthermore, it is of no relevance to the invention whether the label 1 is affixed to the housing 7 by means of an adhesive substance already applied to the reverse side of the first layer 6 or by means of a separate adhesive substance which can also join the second layer 5 directly to the housing part 7.

White or colored sealing devices without inscription and without a barcode are also considered to be labels.

What is claimed is:

1. Device for sealing pressure compensation openings (4) in components, in particular of a motor vehicle control unit, this device being made up of at least two layers (5, 6), wherein the second continuous or partial layer (5) is made of a watertight and gas-permeable material, and the first layer (6) is removed at those places where the pressure compensation takes place and the pressure compensation openings (4) are covered only by the second layer (5).

2. Device for sealing pressure compensation openings (4) in accordance with claim 1, wherein the first layer (6) can be inscribed.

3. Device for sealing pressure compensation openings (4) in accordance with claim 2, wherein the device is used as typeplate or label (1) and the first layer (6) is provided with an alphanumerical text (2) and/or the barcode (3).

* * * * *